United States Patent [19]

Maserjian

[11] Patent Number: 4,531,143
[45] Date of Patent: Jul. 23, 1985

[54] LASER ACTIVATED MTOS MICROWAVE DEVICE

[76] Inventor: Joseph Maserjian, 5668 Pine Cone Rd., LaCrescenta, Calif. 91214

[21] Appl. No.: 542,232

[22] Filed: Oct. 14, 1983

[51] Int. Cl.³ .............................................. H01L 29/78
[52] U.S. Cl. ..................................... 357/23.6; 357/30; 357/58; 357/59
[58] Field of Search ................ 357/30, 23.6, 58, 30 F, 357/30 D, 30 I, 59

[56] References Cited

U.S. PATENT DOCUMENTS

| | | | |
|---|---|---|---|
| 3,523,190 | 8/1970 | Geotzberger et al. | 357/30 X |
| 3,852,119 | 12/1974 | Gosney et al. | 357/58 X |
| 3,882,531 | 5/1975 | Michon et al. | 357/23.6 X |
| 3,917,943 | 11/1975 | Auston | 357/30 X |
| 4,231,050 | 10/1980 | Casey, Jr. et al. | 357/30 X |
| 4,376,285 | 3/1983 | Leonberger et al. | 357/30 X |
| 4,383,267 | 5/1983 | Webb | 357/30 |

OTHER PUBLICATIONS

Jacobus et al., "Optical Detector for Short-Wavelength Light", *IBM Technical Disclosure Bulletin*, vol. 14, No. 9, Feb. 1972, p. 2624.
LeBlanc, "One-Device Storage Cell Method", *IBM Technical Disclosure Bulletin*, vol. 16, No. 3, Aug. 1973, pp. 956-957.
Thaniyavarn et al., "Metal/Tunnel-Barrier/Semiconductor/Tunnel-Barrier/Metal Fast Photodetector", *Appl. Phys. Lett.* 40(3), Feb. 1982, pp. 255-257.

*Primary Examiner*—Andrew J. James
*Assistant Examiner*—William A. Mintel

[57] ABSTRACT

A metal thin oxide silicon (MTOS) optically-activated semiconductor device having respective thin, optically absorptive aluminum layers deposited over a thin oxide layer formed on a silicon substrate over a lightly doped, implant diffused region.

4 Claims, 3 Drawing Figures

LASER ACTIVATED MTOS MICROWAVE DEVICE

ORIGIN OF THE INVENTION

The invention described herein was made in the performance of work under a NASA Contract and is subject to the provisions of Section 305 of the National Aeronautics and Space Act of 1958, Public Law 85-568 (72 STAT 435; 43 USC 2457).

BACKGROUND OF THE INVENTION

1. Field of the Invention

The subject invention relates to a semiconductor device usable as an optoelectronic switch, pulse generator or optical detector.

2. Background of the Invention

Prior art optoelectronic switches are known which are based upon structures employing silicon or III-V semiconductor substrates. See Auston, U.S. Pat. No. 3,917,943 and Leonberger et al., U.S. Pat. No. 4,376,285. Such devices present several drawbacks including relatively slow turn-off speeds and reduced efficiency due to uncontrolled surface effects. For example, Auston requires a separate laser pulse to turn off his device as a result of the long minority carrier recombination time. Leonberger et al. propose a faster time without a laser turn-off pulse by using an indium-phosphide substrate. Such a device is still limited by the minority carrier recombination problem and therefore is relatively slow in turning off.

In Applied Physics Letters, 40, p. 255 (1982), Thanivavarn and Gustafson describe a fast optical detector fabricated of metal/tunnel oxide/silicon/tunnel oxide/metal. The tunneling oxide structure would appear to limit performance of the device and preclude it from operating in a steady high frequency mode.

It is an object of the subject invention to provide a device usable as a high frequency optoelectronic switch which avoids the long relaxation times and surface effects of prior art devices.

It is another object of the invention to provide such a switch employing an established fabrication technology.

It is yet another object of the invention to provide an optically activated, semiconductor microwave device having general application in microwave science, engineering and communication systems.

SUMMARY OF THE INVENTION

The foregoing objects are achieved by a new combination of elements defining a laser-operated solid state microwave circuit component composed of back-to-back capacitors on an intrinsic silicon chip. Light from a laser is absorbed through thinned areas of the capacitor electrodes. A thin oxide layer under the electrodes provides a large oxide capacitance per unit area, coupled to the silicon depletion capacitance and is thick enough to avoid tunneling effects and to exhibit nonconductivity at a suitable voltage level across one capacitor.

The dimensions of the metallization on the semi-insulating silicon substrate may be chosen for the desired impedance in a stripline construction of a microwave device. Such a device may function as a laser-operated microwave switch, a laser-activated pulse generator, or a fast-response optical detector.

BRIEF DESCRIPTION OF THE DRAWINGS

The just-summarized invention will now be described in detail in conjunction with the drawings of which.

Figure 1:
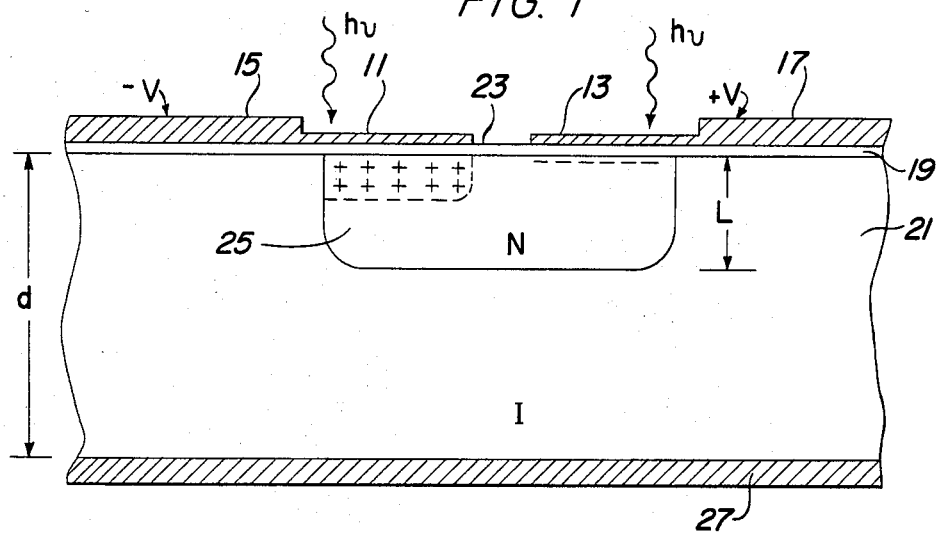
FIG. 1 illustrates a cross-section of the preferred embodiment of the invention.

The preferred embodiment is an MTOS (metal-thin oxide-silicon) device as shown in cross-section in FIG. 1. The device includes first and second thin aluminum layers 11, 13 flanked by thicker aluminum layers 15, 17. These aluminum layers 11, 13, 15, 17 are deposited on a thin silicon dioxide layer 19, which in turn resides on a relatively thick layer 21 of intrinsic (silicon ($>5000\Omega$ cm). A small gap 23 is provided between the two thin aluminum layers 11, 13, exposing a portion of the silicon dioxide layer 19. To complete the structure shown in FIG. 1, an implant diffused region 25 and a uniform aluminum underside layer 27 are provided. This structure provides two capacitors with respective electrodes formed by the thin aluminum layers 11, 13. These layers 11, 13 are also light absorptive.

The dimensioning of the structure of FIG. 1 will now be described. The thick aluminum layers 15, 17 are preferably of a thickness greater than 100 nanometers (100 nM). The thin aluminum layers 11, 13 are no greater than 10 nM in thickness such that they are light absorptive. These thin layers 11, 13 may be replaced with a thicker polysilicon layer. The thin oxide layer 19 is about 10 nM in thickness and provides a large oxide capacitance per unit area coupled to the silicon depletion capacitance. The oxide layer 19 is thick enough to be nonconducting below about 7 volts across the capacitor and to avoid tunneling effects. The implant-diffused region 25 should be light doping, e.g., $\sim 10^{16}$ cm$^{-3}$, N type, to provide a reasonably large depletion region at inversion ($\sim 1 \mu M$) and, correspondingly, low capacitance per unit area. The depth of the diffused region L should be thick enough ($>2 \mu M$) to provide a conductive path between the two capacitors at microwave frequencies.

Figure 2:
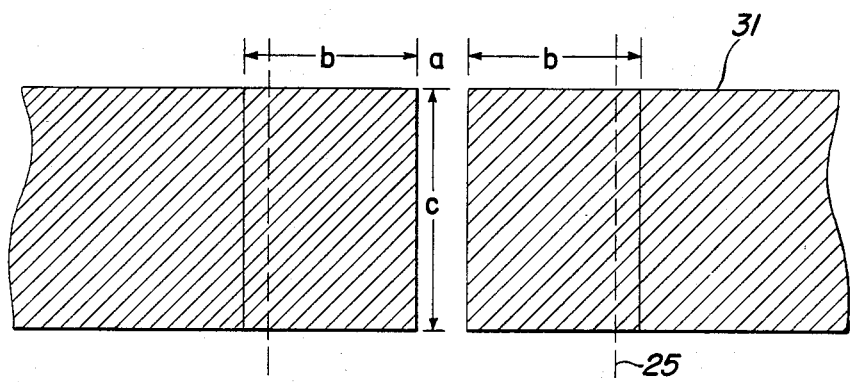
FIG. 2 illustrates a stripline embodiment of the invention.

FIG. 2 shows use of the structure of FIG. 1 in a strip line 31 embodiment. The dimensions shown in FIG. 1 and FIG. 2 may be optimized for microwave operation. The width of the gap 23, denoted "a" in FIG. 2, is as narrow as possible (1 to 3 $\mu M$). The width c of the metal strip is chosen to give the desired impedance of a strip line on the semiconducting (I) silicon chip of thickness d. The metal pattern may be structured into any desired configuration as part of a microwave network, as long as the silicon behaves as a dielectric at frequencies $>\frac{1}{2}\pi \rho_I \epsilon_s$ where $\rho_I$ represents resistivity of the intrinsic silicon and $\epsilon_s$ represents the dielectric constant.

The following discussion will further illustrate selection of the parameters of the device of FIGS. 1 and 2 to function as a laser-activated microwave switch.

Figure 3:
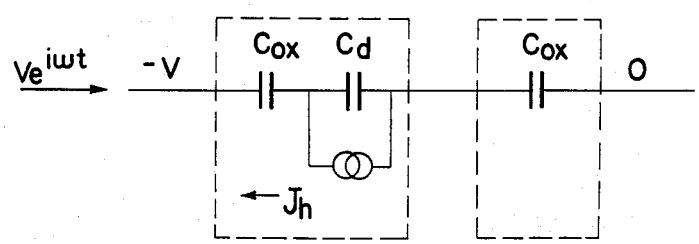
FIG. 3 illustrates a circuit equivalent of the preferred embodiment.

The principle of operation is based on the well-known illumination effect phenomena of MOS capacitors. There are two mechanisms: (1) change in generation rate in the depletion region and (2) change in the population of minority carriers in the neighborhood of the depletion region. The first mechanism is of interest for the fastest possible response time. The first mechanism can be described in terms of the equivalent circuit under instantaneous bias of an ac signal $Ve^{i\omega t}$ as shown in FIG. 3.

The left capacitor is (at the indicated time) reverse-biased into inversion and the right capacitor forward-biased into accumulation (becoming $C_{ox}$). Therefore the total capacitance (dark) is:

$$C_{dark} = \frac{C_{ox}C_d}{2C_d + C_{ox}} \quad \overline{C_{ox} >> C_d} > C_d.$$

$J_h$ is the generation current of minority carriers (holes). The thermal contribution is totally negligible at high frequencies. By irradiation with laser light, with photon energy $h\nu$ greater than the silicon band gap:

$$J_h = \frac{eF}{h\nu} \cdot \eta \tag{1}$$

where F is the laser intensity (watts/cm$_2$), $h\nu$ is the photon energy (joules), and $\eta$ is the quantum efficiency (fraction of incident photons which generate holes in depletion region). Clearly, if $J_h$ is large enough, $C_d$ becomes bypassed and, in the limit, the total capacitance under illumination C approaches $C_{ox}/2$.

The frequency dependence for this effect can be written as:

$$\frac{1}{C} = \frac{2}{C_{ox}} + \frac{1}{C_d} \frac{\omega^2\tau^2}{1 + \omega^2\tau^2} \tag{2}$$

where $\tau$ is the time constant for minority carrier (hole) generation in the inversion layer, and can be estimated from:

$$\tau = \frac{C_{ox}V}{2bc\,J_h} \tag{3}$$

which is just the time for the current density $J_h$ to charge $C_{ox}$ to the full voltage (V/2), which would occur if $C_d$ were absent. From Eq. (2):

$$C \overline{\omega^2\tau^2 >> 1} > C_d$$

$$\overline{\omega^2\tau^2 << 1} > C_{ox}/2$$

which are the limiting cases already mentioned. Therefore, the laser intensity F required for switching the capacitance states at frequency $\omega$ becomes:

$$F > \frac{h\nu C_{ox} V\omega}{2\eta ebc}$$

Choosing
$\omega = 10^{10} \text{sec}^{-1}$, $\eta = 0.1$, $h\nu = 1.4$ eV $C_{ox}/bc = 3.4 \cdot 10^{-7} f/\text{cm}^2$, $V = 2$ volts, one obtains $F > 4.8 \cdot 10^4$ watt/cm$^2$. Such intensities are readily achievable with lasers.

The parasitic cutoff frequency must also be considered. This frequency can be estimated from:

$$\omega_c = \frac{1}{R_s C}$$

using $R_s$ $$\frac{\rho_N l}{bc}, \quad l = f(a, b, L)$$

and $$C \leq \frac{C_{ox}}{2} = \frac{\epsilon_{ox}bc}{2d_{ox}}$$

$$\omega_c \gtrsim \frac{1}{\epsilon_{ox}\rho_N} \frac{2\,d_{ox}}{l}$$

Choosing
$d_{ox} = 10$ nM, $\rho_N = 0.5\Omega$ cm and
$\epsilon_{ox} = 3.4 \cdot 10^{-13} f/\text{cm}$, $l = 10$ $\mu$M:

$$\omega_c > 1.2 \; 10^{10} \text{sec}^{-1}$$

or
$$f_c > 2.0 GH$$

This cutoff can be increased as required by appropriate adjustments of L, $D_{ox}$, $\rho_N$ or $a+b$. However, some constraint exists on $d_{ox}$ and $a+b$ (a should be small compared with b to minimize $R_s$) because of impedance matching requirements. For example, selecting a 50$\Omega$ impedance strip line, the desired "on" capacitance state may be 50$\Omega$, corresponding to approximately 3 dB transmission. That is $$\frac{2}{\omega\,C_{ox}} = 50.$$

Choosing $\omega = 10^{10}$, b=5 $\mu$M (a=2 $\mu$M), $d_{ox} = 10$ nM, one obtains c=240 $\mu$M. This value is quite reasonable or may be tapered to the width of the strip line. Likewise, an interdigitated structure may be used to optimize the area for optical coupling.

A second mechanism to be considered involves change in minority population near the depletion region. This effect would increase the quantum efficiency but at the expense of slower response. If one wishes to suppress this effect to avoid a long additional tail on the response, one may apply a dc bias between the top and back contacts to sweep the holes away from the capacitor towards the back contact. Alternately, one may choose to enhance the effect (and increase the quantum efficiency) by biasing in the opposite direction to sweep the holes towards the capacitor. With such a drift field applied, the frequency response may still be sufficient for most applications, and the required laser intensity would be substantially smaller ($\sim 1/10$).

A final point concerns ac impedance switching. If the MOS flat-band voltage is near zero, the two back-to-back capacitances will exhibit in the "off" state a combined capacitance peak (at zero voltage) which will degrade the performance. This can be easily corrected with a small dc bias to the N-region.

The device shown in FIGS. 1 and 2 may also serve as a laser-activated pulse generator. By applying a dc bias V to the back-to-back capacitors, they can be charged in the off state to a small level (V $C_d$). When illuminated with a laser pulse the capacitance increases to $C_{ox}/2$ and charges to $VC_{ox}/2$. Therefore, a current pulse must flow in response, thus generating a pulse along the strip line. Other considerations remain essentially the same as for impedance switching.

Thus, a back-to-back capacitor MTOS chip configuration is disclosed which is sensitive to an impinging optical flux. The metallization, doping, and substrate dimensions have been selected to be compatible with microwave frequencies so that various component effects can be realized and controlled, for example, by a solid-state laser control pulse source.

It will be appreciated by those skilled in the art that the subject invention is subject to numerous adaptations and modifications without departing from the scope thereof. Therefore, it is to be understood that, within the scope of the appended claims, the invention may be practiced other than as specifically described herein.

What is claimed is:
1. A semiconductor device comprising:
   an intrinsic silicon substrate;
   a lightly doped region in said silicon substrate;
   a dielectric layer formed on said silicon substrate and over said lightly doped region; and
   first and second light absorptive, conductive layers, each residing on said dielectric layer and extending over said lightly doped region, said first and second conductive layers being spaced apart by a gap, said gap residing over said lightly doped region.

2. The semiconductor device of claim 1 wherein said dielectric layer is an oxide layer of a thickness sufficient to prevent tunneling effects.

3. The semiconductor device of claim 2 wherein said first and second conductive layers each step up to a thicker nonlight absorptive structure near the edge of said lightly doped region.

4. The semiconductor device of claims 1, 2 or 3 wherein said lightly doped region is implant diffused.

* * * * *